US010217627B2

(12) United States Patent
Lu et al.

(10) Patent No.: US 10,217,627 B2
(45) Date of Patent: Feb. 26, 2019

(54) METHODS OF NON-DESTRUCTIVE POST TUNGSTEN ETCH RESIDUE REMOVAL

(71) Applicant: Applied Materials, Inc., Santa Clara, CA (US)

(72) Inventors: Danny Chien Lu, Gilroy, CA (US); Yi Zhou, Fremont, CA (US); Changhun Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 79 days.

(21) Appl. No.: 14/045,786

(22) Filed: Oct. 3, 2013

(65) Prior Publication Data
US 2015/0096589 A1 Apr. 9, 2015

(51) Int. Cl.
*H01L 21/02* (2006.01)
*C23G 5/00* (2006.01)
*H01J 37/32* (2006.01)
*B08B 3/00* (2006.01)

(52) U.S. Cl.
CPC .......... *H01L 21/02071* (2013.01); *C23G 5/00* (2013.01); *H01J 37/32082* (2013.01); *H01J 37/32357* (2013.01); *B08B 3/00* (2013.01)

(58) Field of Classification Search
None
See application file for complete search history.

(56) References Cited

U.S. PATENT DOCUMENTS

| 5,773,201 A * | 6/1998 | Fujimura ............... G03F 7/427 |
| | | 134/1.2 |
| 6,372,150 B1 * | 4/2002 | Wong et al. .................... 216/13 |
| 8,043,434 B2 * | 10/2011 | Chebi et al. .................. 134/1.2 |
| 8,058,181 B1 * | 11/2011 | Chen et al. .................... 438/749 |
| 2004/0074869 A1 * | 4/2004 | Wang et al. .................... 216/63 |
| 2004/0194268 A1 * | 10/2004 | Halsey et al. ............... 29/25.01 |
| 2004/0237997 A1 * | 12/2004 | Rui et al. ........................ 134/1.1 |
| 2010/0200016 A1 * | 8/2010 | Yancey .......................... 134/1.1 |

FOREIGN PATENT DOCUMENTS

WO WO 2013/020042 * 2/2013 ............ H05B 7/18

* cited by examiner

Primary Examiner — Nicole Blan
Assistant Examiner — Pradhuman Parihar
(74) Attorney, Agent, or Firm — Patterson + Sheridan, LLP

(57) ABSTRACT

Embodiments of the invention generally relate to methods of removing and/or cleaning a substrate surface having refractory metal portions disposed thereon using water vapor plasma treatment. In one embodiment, a method for cleaning a surface of a substrate includes positioning a substrate in a processing chamber, the substrate having a refractory metal disposed thereon, forming a process gas comprising water vapor, maintaining a process pressure in the processing chamber above about 0.5 Torr, forming a plasma in the process gas to form an activated water vapor and exposing the refractory metal to the activated water vapor.

18 Claims, 4 Drawing Sheets

METHODS OF NON-DESTRUCTIVE POST TUNGSTEN ETCH RESIDUE REMOVAL

BACKGROUND

Field

Embodiments of the invention generally relate to methods of removing a contaminant from a metal surface. More particularly, to methods of removing a post-etch residues from a metal surface.

Description of the Related Art

The continuous shrinkage of microelectronic devices such as capacitors and gates over the years has led to a situation where the materials traditionally used in integrated circuit technology are approaching their performance limits. Accordingly, a demand has arisen for decreasing the resistance of the gate electrode of a transistor used in a DRAM or flash memory. Although polysilicon is conventionally used as the gate electrode, polysilicon has the drawback that the sheet resistance is high. Therefore, as a metal having a low resistance value, high adhesion to a silicon oxide film and silicon itself, and high processability, it has been proposed to stack a refractory metal such as tungsten as the gate electrode.

To fabricate tungsten gate electrodes, the device must be dry etched at points in the manufacturing process. This includes interaction with bromine, fluorine and chlorine, among other harsh chemistries. These chemistries will leave some etch residues on the tungsten layer. These residues need to be removed because they can impact device performance. Therefore, an effective and yet non-destructive method of remove the post etch residue, i.e. abatement, is critical for the tungsten gate based device fabrication.

Conventional chemistries used for post-etch residue removal contain oxygen gas as the plasma source, which will result in substantial surface oxidation of the tungsten. Surface oxidation of the tungsten can lead to degradation of the gate electrical conductivity and subsequent increase of the gate critical dimension (CD). The addition of $H_2$ to the oxygen gas etch has been reported to be able to reduce the surface oxidation of the tungsten. However, extended exposure to $H_2/N_2$ plasma is found to create sidewall damage to features formed in the tungsten, such as the tungsten gate. Furthermore, the H2/N2 plasma does not have the photoresist (etch mask) removal capability, which is required for tungsten gate etch process.

Therefore, there is a need for an improved method of removing or cleaning a substrate surface.

SUMMARY

Embodiments of the invention generally relate to methods of removing residual substances and/or cleaning a substrate surface disposed thereon using water vapor plasma treatment. By using the water vapor plasma process described herein, the residues and/or contaminants can be removed without changing the CD of etched features and without forming an oxidation layer.

In one embodiment, a method for cleaning a surface of a substrate can include positioning a substrate in a processing chamber, the substrate having a refractory metal disposed thereon; forming a process gas comprising water vapor; maintaining a process pressure in the processing chamber above about 1 Torr; forming a plasma in the process gas to form an activated water vapor; and exposing the refractory metal to the activated water vapor.

In another embodiment, a method for cleaning a substrate surface can include positioning a substrate in a processing chamber, the substrate having a refractory metal disposed thereon; exposing the refractory metal to a process gas comprising water vapor supplied into the processing chamber, the processing chamber being maintained at a first pressure; heating the substrate to a first temperature for a first period of time, the first temperature being greater than 100 degrees Celsius; after the first period of time, maintaining the pressure in the processing chamber at a second pressure; forming a first plasma in the process gas to form a first activated water vapor, wherein the refractory metal is exposed to the first activated water vapor for a second period of time; after the second period of time, maintaining the processing chamber at a third pressure; and forming a second plasma in the process gas to form a second activated water vapor, wherein the refractory metal is exposed to the second activated water vapor for a third period of time.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the invention generally relate to methods of removing and/or cleaning a substrate surface having a refractory metal disposed thereon using water vapor plasma treatment. In one embodiment, the material layer is a tungsten containing layer. In another embodiment, the material layer is a fifth period or a sixth period element containing layer. In yet another embodiment, the material layer may be any suitable metallic layers as needed. The methods may be used to remove a substrate surface having the material layer disposed thereon using water vapor plasma treatment. Embodiments of the invention may be practiced in the Axiom™ or AxiswII™ chambers available from Applied Materials, Inc., of Santa Clara, Calif. It is contemplated that other chambers, including those produced by other manufacturers, may benefit from embodiments described herein.

Figure 1:
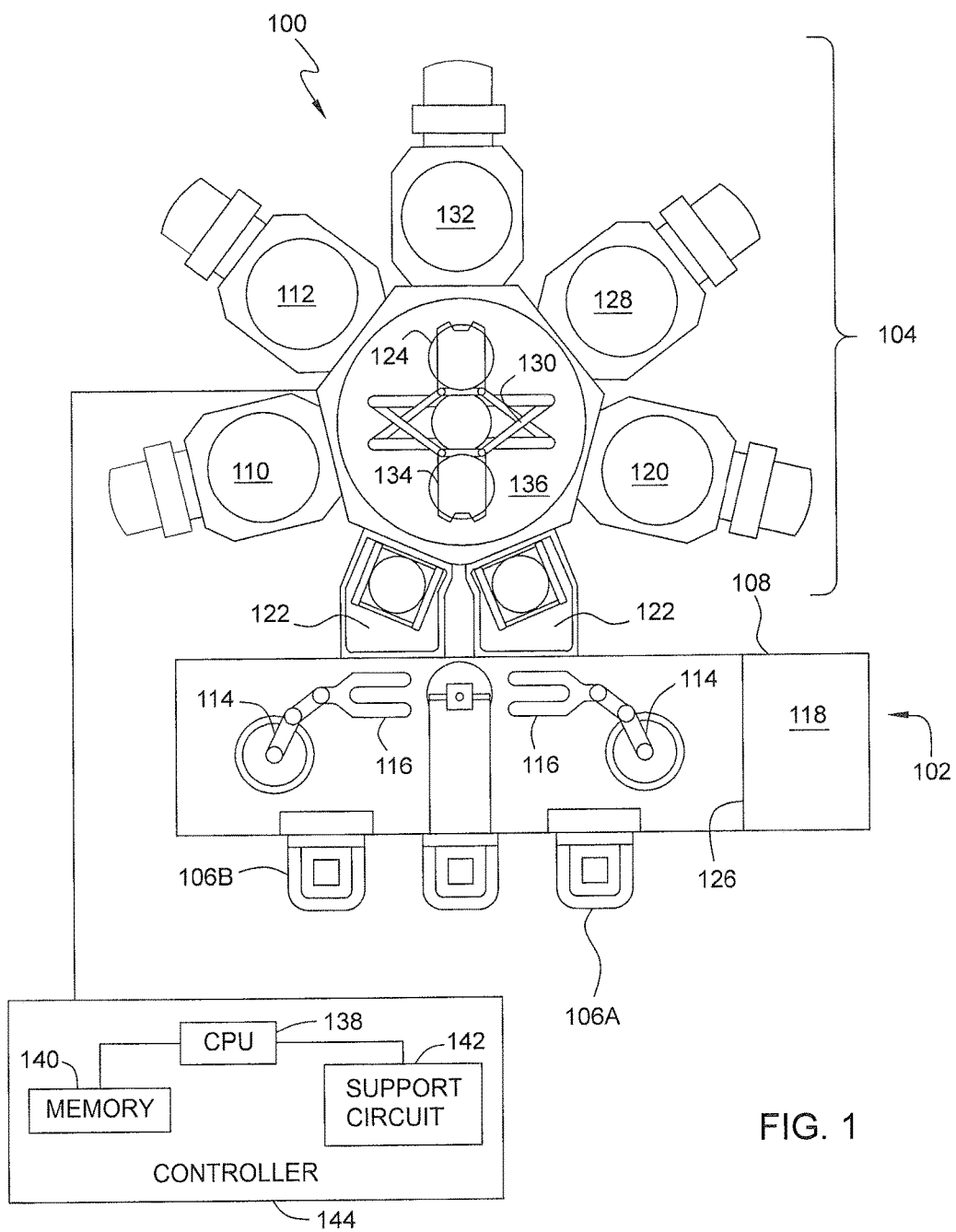
FIG. 1 depicts a schematic diagram of an exemplary processing apparatus that includes one embodiment of a processing chamber useable with one or more embodiments.

FIG. 1 is a schematic, top plan view of an exemplary processing system 100 that includes one embodiment of a processing chamber 122 suitable for practicing embodi ments of the present invention. In one embodiment, the processing system 100 may be a CENTURA® integrated processing system, commercially available from Applied Materials, Inc., located in Santa Clara, Calif. It is contemplated that other processing systems (including those from other manufacturers) may be adapted to benefit from the invention.

The system 100 includes a vacuum-tight processing platform 104, a factory interface 102, and a system controller 144. The platform 104 includes a plurality of processing chambers 110, 112, 132, 128 and 120 and processing chambers 122 that can be coupled to a vacuum substrate transfer chamber 136. Two processing chambers 122 are shown in FIG. 1. The processing chambers 122 described herein can be a load lock chamber. The factory interface 102 is coupled to the transfer chamber 136 by the processing chambers 122.

In one embodiment, the factory interface 102 comprises at least one docking station 108 and at least one factory interface robot 114 to facilitate transfer of substrates. The docking station 108 is configured to accept one or more front opening unified pod (FOUP). Two FOUPS 106A and 106B are shown in the embodiment of FIG. 1. The factory interface robot 114 having a blade 116 disposed on one end of the robot 114 is configured to transfer the substrate from the factory interface 102 to the processing platform 104 for processing through the processing chamber 122. Optionally, one or more metrology stations 118 may be connected to a terminal 126 of the factory interface 102 to facilitate measurement of the substrate from the FOUPS 106A and 106B.

Each of the processing chambers 122 has a first port coupled to the factory interface 102 and a second port coupled to the transfer chamber 136. The processing chambers 122 are coupled to a pressure control system (not shown) which pumps down and vents the processing chambers 122 to facilitate passing the substrate between the vacuum environment of the transfer chamber 136 and the substantially ambient (e.g., atmospheric) environment of the factory interface 102.

The transfer chamber 136 has a vacuum robot 130 disposed therein. The vacuum robot 130 has a blade 134 capable of transferring substrates 124 between the processing chamber 122 and the processing chambers 110, 112, 132, 128 and 120.

In one embodiment, at least one of the processing chambers 110, 112, 132, 128 and 120 is an etch chamber. For example, the etch chamber may be a Decoupled Plasma Source (DPS) chamber available from Applied Materials, Inc. The DPS etch chamber uses an inductive source to produce high-density plasma and comprises a source of radio-frequency (RF) power to bias the substrate. Alternatively, at least one of the process chambers 110, 112, 132, 128 and 120 can be one of a HART™, E-MAX®, DPS®, DPS II, PRODUCER E, or ENABLER® etch chamber also available from Applied Materials, Inc. Other etch chambers, including those from other manufacturers, may be utilized. The etch chambers, for example, chambers 110, 112, 132, 128 and 120 may use a halogen-containing gas to etch the substrate 124 therein. Examples of halogen-containing gas include hydrogen bromide (HBr), chlorine ($Cl_2$), carbon tetrafluoride ($CF_4$), and the like. After etching the substrate 124, halogen-containing residues may be left on the substrate surface, such as on a refractory metal containing layer of the substrate surface. The halogen-containing residues may be removed by treatment processes in the processing chambers 122, as will be further discussed below.

The system controller 144 is coupled to the processing system 100. The system controller 144 controls the operation of the system 100 using a direct control of the process chambers 110, 112, 132, 128 and 120 of the system 100 or alternatively, by controlling the computers (or controllers) associated with the process chambers 110, 112, 132, 128 and 120 and the system 100. In operation, the system controller 144 enables data collection and feedback from the respective chambers and system controller 144 to optimize performance of the system 100.

The system controller 144 generally includes a central processing unit (CPU) 138, a memory 140, and support circuit 142. The CPU 138 may be one of any form of a general purpose computer processor that can be used in an industrial setting. The support circuits 142 are conventionally coupled to the CPU 138 and may comprise cache, clock circuits, input/output subsystems, power supplies, and the like. The software routines, such as a method 300 for removing halogen-containing residues described below with reference to FIG. 3, when executed by the CPU 138, transform the CPU 138 into a specific purpose computer (controller) 144. The software routines may also be stored and/or executed by a second controller (not shown) that is located remotely from the system 100.

Figure 2:
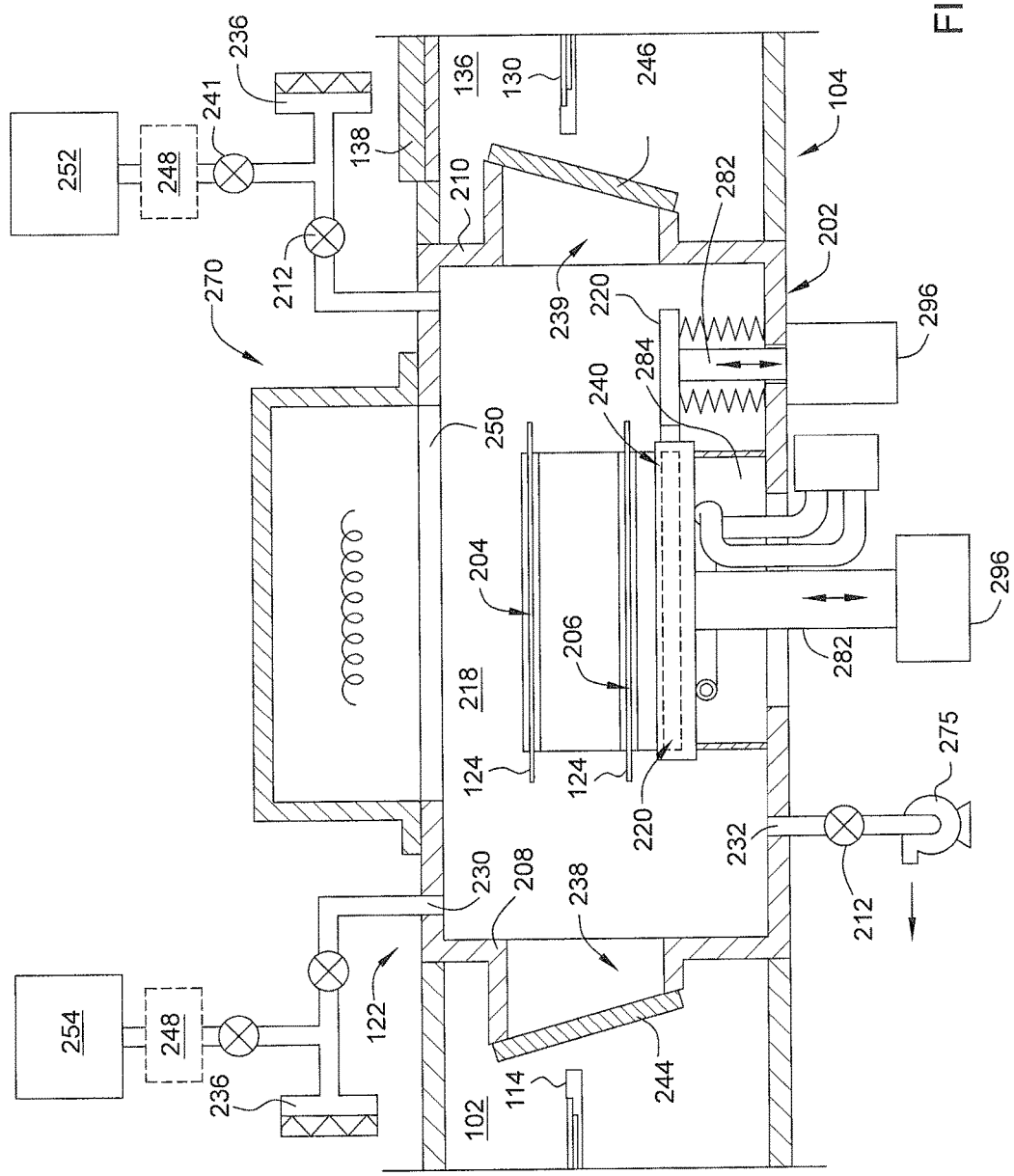
FIG. 2 depicts a side view of a processing chamber useable with one or more embodiments.

FIG. 2 depicts one embodiment of the processing chamber 122. The processing chamber 122 can be utilized to perform a halogen-containing residue removal process. The processing chamber 122 generally comprises a chamber body 202, a first substrate holder 204, a second substrate holder 206, a temperature control pedestal 240 and a heater module 270. The chamber body 202 may be fabricated from a singular body of material such as aluminum. The chamber body 202 includes a first side wall 208, a second side wall 210, lateral walls (not shown), a top 214 and a bottom 216 that define a chamber volume 218. A window 250, which can be comprised of quartz, is disposed in the top 214 of the chamber body 202. The window 250 is at least partially covered by the heater module 270.

The pressure of the chamber volume 218 may be controlled so that the processing chamber 122 may be evacuated to substantially match the environment of the transfer chamber 136 and be vented to substantially match the environment of the factory interface 102. Additionally, the pressure of the chamber volume 218 may be controlled within a predetermined range that facilitates performing the halogen-containing residues removal process, as further described below. The chamber body 202 includes one or more vent passages 230 and a pump passage 232. The vent passage 230 and the pump passage 232 are positioned at opposite ends of the chamber body 202 to induce laminar flow within the chamber volume 218 during venting and evacuation to minimize particulate contamination. In one embodiment, two vent passages 230 are disposed through the top 214 of the chamber body 202, while the pump passage 232 is disposed through the bottom 216 of the chamber body 202. The passages 230 and 232 typically are coupled to a valve 212 to selectively allow flow into and out of the chamber volume 218. Alternatively, the passages 230 and 232 may be positioned at opposite ends of one of the chamber walls, or on opposing or adjacent walls. In one embodiment, the vent passage 230 is coupled to a high efficiency air filter 236.

The vent passage 230 may be additionally coupled to a gas source 252 through a valve 241 to provide a gas mixture into the chamber volume 218. In one embodiment, the vent passage 230 may be configured as a gas distribution ring wherein the gas mixture may be distributed from adjacent the walls 210, 208 through an array of holes to optimize the flow uniformity. In another embodiment, the gas mixture may be supplied to the processing chamber 202 through a gas distribution plate (not shown) disposed below the heater module 270. The gas distribution plate may be fabricated by a material transmissive to the heat generated from the heater module 270 such as not to substantially interfere with the heating of the substrates positioned on the substrate holders 204, 206. Examples of gases that may be supplied from the gas source 252 include nitrogen ($N_2$), argon (Ar), hydrogen ($H_2$), helium (He), oxygen ($O_2$), ozone ($O_3$), water vapor ($H_2O$), and the like.

In one embodiment, a water vapor generating (WVG) system 254 is coupled to the processing chamber 122 and is in fluid communication with the chamber volume 218 defined in the processing chamber 122. The WVG system 254 generates ultra-high purity water vapor by means of a catalytic reaction of $O_2$ and $H_2$. Alternatively, the WVG system 254 may also generate water vapor by directly vaporizing water ($H_2O$) into water vapor as needed. In one embodiment, the $H_2$ and the $O_2$ each flow into the WVG system 254 at a rate in the range from about 1 sccm to about 3000 sccm. In the embodiment, wherein an $O_2$ enriched water vapor is required, the flow of $O_2$ is the configured to be higher than the flow of $H_2$ and vice versa. Once a desired $H_2/O_2$ concentration is determined, each flow rate may be proportionately altered to adjust the outward flowing water vapor with the same or different $H_2/O_2$ concentration.

In one embodiment, the WVG system 254 has a catalyst-lined reactor or a catalyst cartridge in which water vapor is generated by means of a chemical reaction. The catalyst may include a metal or alloy, such as palladium, platinum, nickel, combinations thereof and alloys thereof. The ultra-high purity water is ideal for a cleaning process to eliminate undesired contamination or purity formed to the underlying dielectric layer disposed on the substrate 124. In one embodiment, to prevent unreacted $H_2$ from flowing downstream, $O_2$ is allowed to flow through the WVG system 254 prior to the introduction of $H_2$, for example for about 5 seconds. Next, $H_2$ is allowed to enter the reactor for about 5 seconds. The $O_2$ continues to flow concurrent with $H_2$. The catalytic reaction between $H_2$ and $O_2$ is instantaneous, so water vapor is generated immediately after the $H_2$ and $O_2$ reach the reactor. Regulating the flow of $H_2$ and $O_2$ allows the concentration of the hydrogen and the oxygen present in the water vapor to be precisely controlled from 1% to 100% concentrations. Stated another way, the water vapor may contain water, $H_2$, $O_2$ or combinations thereof at controlled concentrations. In one example, the water vapor contains water and $O_2$. In another example, the water vapor contains water and $H_2$. Similarly, by employing the method of gas flow control during water vapor generation, the amount of water vapor may also be regulated, yielding accurate and repeatable flows. While water vapor is usually generated by flowing $H_2$ and $O_2$ into the reactor, the $O_2$ may be supplemented or substituted with another oxygen source compound, such as NO, $N_2O$, $NO_2$, $N_2O5$, $H_2O_2$ or $O_3$. In one embodiment, $H_2$ and $N_2O$ are utilized to form a water vapor as needed. Suitable WVG systems 254 are commercially available, such as the WVG by Fujikin of America, Inc., located in Santa Clara, Calif., and the CSGS (Catalyst Steam Generator System) by Ultra Clean Technology, located in Menlo Park, Calif. It is noted that the WVG system 254 may also be any kind of equipment that capable to generate water vapor in any concentration.

In one embodiment, a remote plasma source (RPS) 248 may be alternatively coupled to the vent passage 230 to assist in removing the halogen-containing residues from the substrate surfaces. The remote plasma source 248 provides plasma formed from the gas mixture provided by the gas source 252, the WVG system 254 or combinations thereof, to the processing chamber 122. In one embodiment, the remote plasma source (RPS) 248 is present, a diffuser (not shown) may be disposed at the outlet of the vent passage 230 to facilitate delivery the generated plasma into the processing chamber 122.

The pump passage 232 is coupled to a point-of-use pump 275, such as available from Alcatel, headquartered in Paris, France. The point-of-use pump 275 has low vibration generation to minimize the disturbance of the substrate 124 positioned on the holders 204 and 206 within the processing chamber 122 while promoting pump-down efficiency and time by minimizing the fluid path between the processing chamber 122 and pump 275 to generally less than three feet.

A first loading port 238 is disposed in the first wall 208 of the chamber body 202 to allow the substrate 124 to be transferred between the processing chamber 122 and the factory interface 102. A first slit valve 244 selectively seals the first loading port 238 to isolate the processing chamber 122 from the factory interface 102. A second loading port 239 is disposed in the second wall 210 of the chamber body 202 to allow the substrate 124 to be transferred between the processing chamber 122 and the transfer chamber 136. A second slit valve 246 which is substantially similar to the first slit valve 244 selectively seals the second loading port 239 to isolate the processing chamber 122 from the vacuum environment of the transfer chamber 136.

The first substrate holder 204 is concentrically coupled to (i.e., stacked on top of) the second substrate holder 206 that is disposed above the chamber bottom 216. The substrate holders 204 and 206 are generally mounted to a hoop 220 that is coupled to a shaft 282 that extends through the bottom 216 of the chamber body 202. Typically, each substrate holder 204 and 206 is configured to retain one substrate. The shaft 282 is coupled to a lift mechanism 296 disposed exterior to the processing chamber 122 that controls the elevation of the substrate holders 204 and 206 within the chamber body 202. A bellows 284 is coupled between the hoop 220 and the bottom 216 of the chamber body 202 and disposed around the shaft 282 to provide a flexible seal between the second substrate holder 206 and the bottom 216, thus preventing leakage from or into the chamber body 202 and facilitating raising and lowing of the substrate holders 204 and 206 without compromising the pressure within the processing chamber 122.

The first substrate holder 204 is utilized to hold an unprocessed substrate from the factory interface 102 while the second substrate holder 206 is utilized to hold a processed substrate (e.g., an etched substrate) returning from the transfer chamber 136. The flow within the processing chamber 122 during venting and evacuation is substantially laminar due to the position of the vent passage 230 and pump passage 232 and is configured to minimize particulate contamination.

Figure 3:
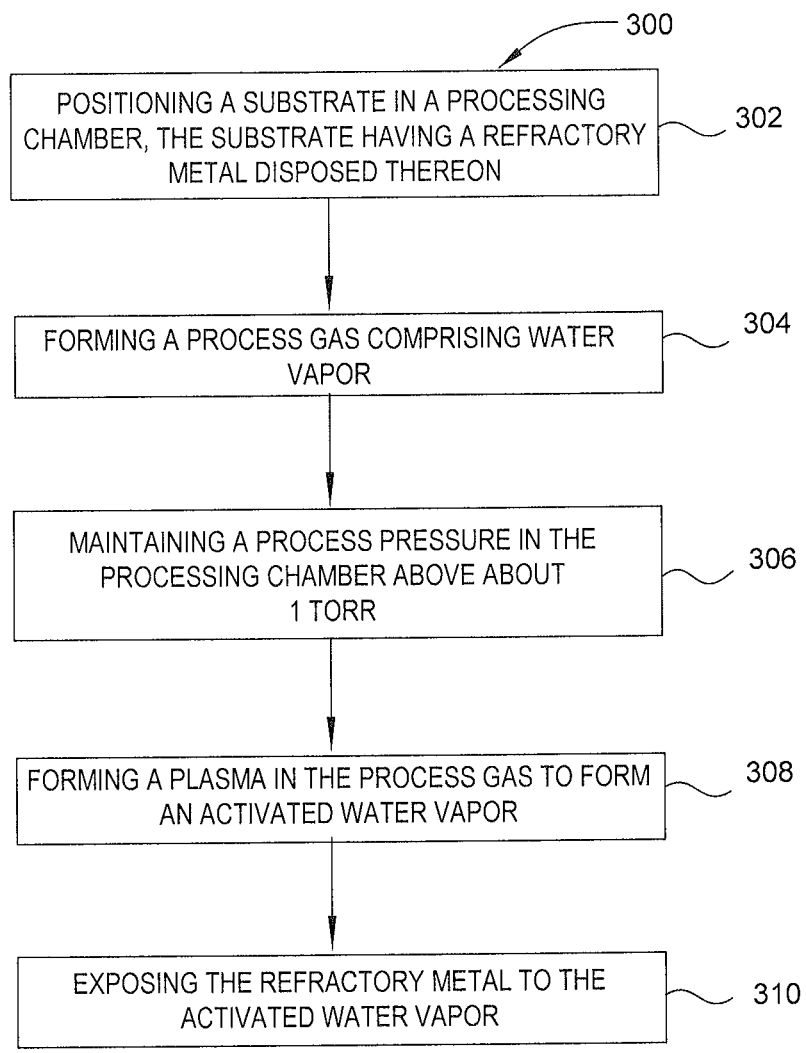
FIG. 3 illustrates a process flow diagram of a method for removing a contaminant from the surface of a substrate, according to one embodiment.

FIG. 3 illustrates a process flow diagram of a method 300 for removing a contaminant from the surface of a substrate, according to one embodiment. The method 300 begins at element 302 by positioning a substrate in a processing chamber, the substrate having a refractory metal disposed thereon. In one embodiment, the processing chamber can be an etching chamber as described above. In another embodiment, the processing chamber is a processing chamber, as described with reference to FIGS. 1 and 2. It is contemplated that other process chambers, such as other etching chambers or deposition chambers, including those available from other manufacturers, may be utilized. The substrate may have a refractory metal layer disposed thereon. The substrate may have a substantially planar surface, an uneven surface, or a substantially planar surface having a structure formed thereon. The refractory metal may be disposed over at least a portion of the surface of the substrate or the structure, if present.

In one embodiment, the refractory metal layer may be a fifth period material, a sixth period material. Exemplary fifth period materials include niobium and molybdenum. Exemplary sixth period materials include tantalum, tungsten, and rhenium. In another embodiment, the refractory metal layer may include a composite of a fifth period material and a sixth period material, a composite of two or more fifth period materials, a composite of two or more fifth period materials or sixth period materials, or another metal, such as aluminum.

The refractory metal layer has been patterned or etched to form openings, such as vias, trenches, channels, or other suitable structures within the refractory metal layer, such as by utilizing a halogen-containing or other suitable etchant. It is noted that the term "opening" referred here includes all kinds of structures that have open areas formed therein including channels, between islands, vias, between all kinds of structures, or the like. In certain embodiments, a hard mask layer used to etch the refractory metal layer may be eliminated as needed based on different process requirement. The hard mask layer protects certain regions of the refractory metal layer from etching while exposing other regions of the refractory metal layer for etching to form the openings until the underlying surface of the substrate is exposed. In some embodiments, a photoresist layer may be disposed on the hard mask layer to assist forming openings in the refractory metal layer.

Once the substrate is positioned in the processing chamber, a process gas comprising water vapor can be formed, as in element 304. Water vapor can be formed as described above with reference to FIG. 2. The water vapor may be formed remotely from or in the processing chamber.

As discussed above, the residuals, such as halides, carbon residues and trace metal contamination, are present on the upper surface of the refractory metal layer, as well as and the sidewalls/bottom surface of features, during a previously performed etching process. During etching, the substrate and the refractory metal layer thereon are exposed to an etchant, for example a fluorine containing gas, to etch a desired pattern into the refractory metal and other components. The etching process produces halide residues, which may also include silicon, carbon and/or oxygen.

Once the process gas including the water vapor is formed, the process pressure is set and maintained at a pressure of greater than about 1 Torr and the flow rate of at least about 1000 sccm, as in element 306. The flow rates disclosed are for use with a 300 mm substrate. As such, the approximate flow rate can be about 0.0141 sccm/mm$^2$. In one embodiment, the process pressure is maintained at a pressure between about 2 Torr and about 4 Torr and the flow rate is between about 2000 sccm and about 3000 sccm for a 300 mm substrate (between about 0.0283 sccm/mm$^2$ and about 0.0141 sccm/mm$^2$ of substrate).

By maintaining a high process pressure and high flow rate, the dominant species between H$^+$ ions and O$^-$ ions can be controlled. The available species is controlled by recombination inside the plasma volume. At high flow and high pressure, O$^-$ ions partially recombines with H$^+$ ions which reduces the number of O$^-$ ions by creating OH$^-$ ions. By reducing the number of O$^-$ ions, the oxidation of the refractory metal layer is reduced without reducing the overall cleaning.

A plasma is then formed in the process gas to form an activated water vapor, as in element 308. The plasma may be formed using the water vapor or the plasma may be formed using a secondary gas, such as an inert gas. The process gas would be present in the plasma when used as the plasma initiating gas. When a secondary gas is used as the plasma initiating gas, the process gas would be delivered to the plasma. Activated water vapor includes the products generated from the water vapor in the plasma, including oxidizer (O$^-$), reducer (H$^+$), and hydroxyl groups (OH$^-$). It is believed that oxygen oxidizer can react with the contaminants from the etching process to form a volatile compound which may be exhausted from the chamber while the hydrogen reducer may react with the halides, if any, in the refractory metal layer to form a volatile compound (e.g., $B_2H_6$) which is then exhausted from the chamber.

In one embodiment, it is contemplated that the water vapor plasma process at element 308 can be capacitively coupled or inductively coupled in addition to or as an alternative to being remotely generated. For example, it is contemplated that a capacitively coupled plasma may be generated from a water vapor and an inert gas. The water vapor may be introduced to the chamber at a flow rate between about 5 sccm and about 3000 sccm, such as about 3000 sccm. The inert gas, such as Ar or He, may be provided to the chamber at a flow rate of between about 5 sccm and about 3000 sccm, such as about 1000 sccm. In another embodiment, it is contemplated that the water vapor may be generated via in situ steam generation as needed.

In addition, while forming the activated water vapor at 308, other different gas sources may also be supplied into the process chamber to enhance the reaction efficiency. In one example, the water vapor contains water and further O$_2$ gas. In another example, the water vapor contains water and further H$_2$ gas. In yet another embodiment, the water vapor contains water and further O$_2$ and H$_2$ gas as needed. The addition of hydrogen can increase the removal rate of the halides from the refractory metal layer, especially in tungsten layers as tungsten itself catalyzes the ionization of H$_2$ to H$^+$. The addition of other carrier gases, such as helium, argon or nitrogen, can affect the rate of halide removal from the refractory metal layer.

In the embodiment wherein an oxygen containing gas may also be supplied with the water vapor into the process chamber to perform the plasma treatment process, it is contemplated that any compound which provides oxygen, such as O$_2$, N$_2$O, CO$_2$, NO, or NO$_2$, may be used and supplied with the water vapor at element 308. In the embodiment wherein a hydrogen containing gas may also be supplied with the water vapor into the process chamber to perform the plasma treatment process, it is contemplated that any compound which provides hydrogen, such as H$_2$, NH$_3$ or H$_2$O$_2$ may be used at element 308.

In one embodiment, it is contemplated that non-stoichiometric combinations of oxygen and hydrogen (e.g., H$_x$O$_y$, where x and y may be integers or non-integers both greater than 1) including H$_2$O$_2$ may be input to or generated by the WVG system 254, described with reference to FIG. 2. In such an embodiment, some hydrogen peroxide may be generated by the WVG system 254. In another embodiment, it is contemplated that oxygen gas, helium gas, nitrogen gas, argon gas, nitrous oxide gas, and/or hydrogen gas may be provided to the process gas in addition to water vapor as needed.

After the activated water vapor is formed, the refractory metal is exposed to the activated water vapor, at element 310. When the water vapor is broken down in a plasma, a stoichiometric combination of hydrogen and oxygen ions are created (approximately a 2:1 ratio of H$^+$ ions and O$^-$ ions). These molecules are in the form of H$^+$ ions, O$^-$ ions and OH$^-$ ions. In the case of tungsten, tungsten will react with the O$^-$ ions to form tungsten oxides but the tungsten oxide will react with the H$^+$ ions to reduce the tungsten oxide back to tungsten. Using a high pressure and a high flow rate increases the ratio of H$^+$ ions to O$^-$ ions by binding O$^-$ ions into OH$^-$ ions. Control of H$^+$ ions and O$^-$ ions reduces the formation of oxides on the surface of the refractory metal layer from O$^-$ ions while reducing or preventing etching of quartz components in the chamber from the H$^+$ ions.

In operation, several process parameters may also be controlled. In one example, the water vapor may be provided and supplied into the process chamber in either a continuous mode or in a pulsed mode. In one embodiment, the water vapor may be generated in a continuous mode (i.e. at a continuous flow rate) into the process chamber at a flow rate between about 5 sccm and about 3000 sccm. A RF power may be supplied into the process chamber between about 500 Watts and about 5000 Watts to dissociate the water vapor for reaction. The chamber pressure may be controlled at less than about 760 Torr, such as between about 100 mTorr and about 150 Torr, for example from 2 Torr to 4 Torr. The substrate temperature may be controlled from about 100 degrees Celsius to about 400 degrees Celsius. The substrate may be exposed to the water vapor plasma at between about 1 second and about 36000 seconds.

In the embodiment wherein the water vapor is supplied into the process chamber in a pulsed mode, the water vapor may be pulsed into the process at about every 60 seconds. Each pulse can last about 30 seconds. The duty cycles may be controlled at about 1 percent and about 100 percent as needed.

It is believed that it is beneficial to maintain the temperature of the substrate at or above 100 degrees Celsius, such as from 100 degrees Celsius to 350 degrees Celsius, for example between 250 degrees Celsius and 350 degrees Celsius. At temperatures below 100 degrees Celsius, water vapor may condensate on the surface of the substrate, allowing for the formation of oxidation. In another embodiment, the temperature is maintained below 350 degrees Celsius. At temperatures higher than 350 degrees Celsius, device damage may occur (e.g. metal diffusion into a silicon substrate).

In one embodiment, when generating a capacitively coupled water vapor plasma, the spacing between the substrate and a showerhead located within the chamber may be within a range of about 20 mils to about 600 mils. Reduced spacing between the substrate is beneficial when processing substrates in larger volumes (for example, when processing large area substrates) under higher pressures (for example, greater than about 7 Torr). When processing substrates at pressures greater than about 7 Torr, the reduced spacing facilitates plasma sustainability. In one example, when processing a substrate at about 30 Torr, the spacing between the substrate and the face plate may be about 300 mils. At 40 Torr, the spacing between the substrate and the face plate may be within a range of about 240 mils to about 270 mils. At a pressure of about 50 Torr, the spacing between the substrate and the face plate may be less than 200 mils.

Figure 4:
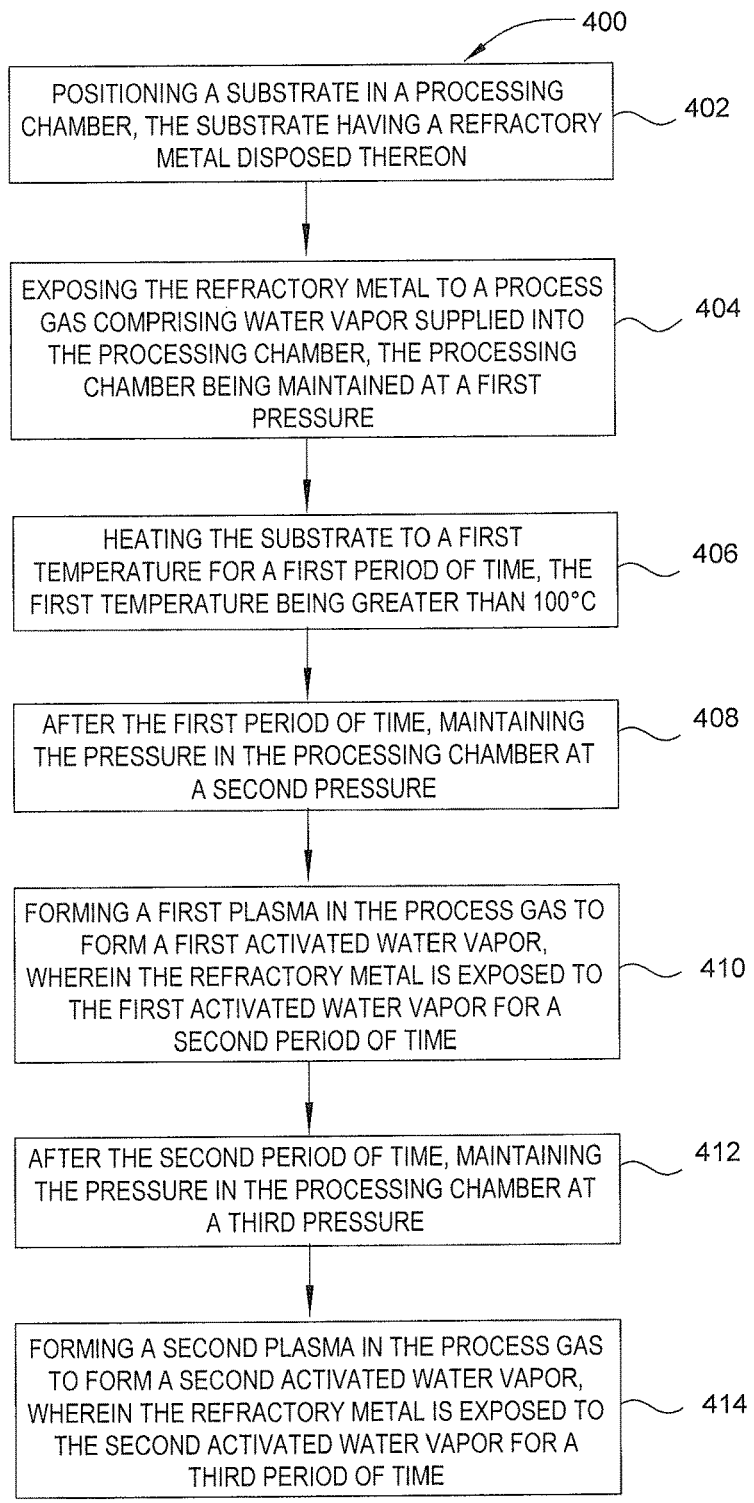
FIG. 4 illustrates a process flow diagram of a method for removing a contaminant, according to another embodiment.

FIG. 4 illustrates a process flow diagram of a method 400 for removing a contaminant from the surface of a substrate, according to another embodiment.

The method 400 begins with positioning the substrate in a processing chamber with a refractory metal disposed thereon, at element 402. At this point, the substrate is positioned on a substrate support in a processing chamber, as described with reference to FIGS. 1 and 2. The substrate has a refractory metal disposed on the surface as described previously. The substrate and the refractory metal may be as described with reference to FIGS. 2 and 3.

With the substrate positioned, the refractory metal can then be exposed to a process gas comprising water vapor, at element 404. Once the substrate is positioned, the process gas can be delivered to the substrate in the processing chamber. The process gas can be delivered at a flow rate described with reference to FIG. 3. In one embodiment, the flow rate of the process gas is between 0.0283 sccm/mm$^2$ to 0.0424 sccm/mm$^2$. At this point, the process gas is not converted nor introduced to a plasma. The processing chamber can be maintained at a first pressure, while the process gas is delivered to the chamber. The first pressure can be a pressure between 1 Torr and 7 Torr, such as between 2 Torr and 4 Torr. In one embodiment, the first pressure is 4 Torr.

The substrate can then be heated to a first temperature, at element 406. The first temperature can be greater than 100 degrees Celsius, such as a temperature of between 100 degrees Celsius and 350 degrees Celsius. It is believed that the removal of contaminants can be benefited by pretreatment of the substrate with water vapor. However, at temperatures lower than 100 degrees Celsius, the water vapor in the process gas can condense on the substrate and oxidize portions of the refractory metal. By keeping the pressure high and temperature within the above described range, condensation of water vapor can be prevented while preparing the substrate for further processing. The exposure to water vapor at the first pressure and the first temperature can be maintained for a first period of time. The first period of time is related to the components on the substrate and the refractory metal used, among other factors. The first period of time can be from 1 second to 15 minutes, such as 15-45 seconds.

Though this process describes heating the substrate after the substrate has achieved a first pressure, this is not intended to be limiting of other possible embodiments. For example, the substrate may be heated to the first temperature prior to or during being exposed to the first pressure.

After the first period of time, the pressure in the processing chamber can be maintained at a second pressure, at element 408. The processing chamber can be maintained at the second pressure during one or more elements of the method 400, such as while the process gas is delivered to the chamber. The second pressure can be a pressure between 0.1 Torr and 5 Torr, such as between 0.5 Torr and 2 Torr. In one embodiment, the second pressure is from 0.7 Torr to 1 Torr. The process gas, described with reference to element 404 and FIGS. 2 and 3, can either be continually delivered during this time, delivered in pulses or delivery can be stopped during the pressure change. The pulsed delivery of the process gas can create a flow rate equivalent to a continual delivery of the process gas. At this point the temperature of the substrate can be maintained the same as above (described with reference to element 406), within the same range as above or at a different temperature entirely, such that the temperature is within the working range of the substrate. In one embodiment, the flow rate of the process gas is between 0.00707 sccm/mm$^2$ to 0.0424 sccm/mm$^2$ of substrate surface.

A first plasma can then be formed in the process gas to form a first activated water vapor, as in element 410. At this point, the refractory metal, as disposed on the substrate, can be exposed to the first activated water vapor. The first activated water vapor can be formed as described with reference to FIG. 2. In one embodiment, the first activated water vapor is formed in the processing chamber using an RF power of from about 3000 Watts to about 5000 Watts. The exposure to first activated water vapor at the second pressure can be maintained for a second period of time. The second period of time can be from about 0 seconds to about 15 minutes, such as from about 0 seconds to about 5 seconds.

After the second period of time, the pressure in the processing chamber can be maintained at a third pressure, at element 412. The processing chamber can be maintained at the third pressure during one or more of the elements of the method 400, such as while the process gas is delivered to the chamber. The third pressure can be a pressure between about 0.1 Torr and about 5 Torr, such as between about 0.5 Torr and about 2 Torr. In one embodiment, the third pressure is from about 0.7 Torr to about 2 Torr. As described in element 408, the process gas can either be continually delivered during this time, delivered in pulses or delivery can be stopped during the pressure change. Further, the temperature of the substrate can be maintained the same as above (described with reference to element 406), within the same range as above or at a different temperature entirely, such that the temperature is within the working range of the substrate.

A second plasma can then be formed in the process gas to form a second activated water vapor, as in element 414. At this point, the refractory metal, as disposed on the substrate, can be exposed to the second activated water vapor. The second activated water vapor can be formed as described with reference to FIG. 2. In one embodiment, the second activated water vapor is formed in the processing chamber using an RF power of from about 3000 Watts to about 5000 Watts. The exposure to second activated water vapor at the third pressure can be maintained for a third period of time. The third period of time can be from about 0 seconds to about 15 minutes, such as from about 30 seconds to about 120 seconds.

The formation and delivery of the first activated water vapor and the second activated water vapor can be performed using the same parameters, such that the first activated water vapor and the second activated water vapor are formed at the same temperature, pressure, power level, flow rate, or other parameters or any combination thereof. The formation and delivery of the first activated water vapor and the second activated water vapor can be a continuous event. In this way, there is no break between the delivery of the activated water vapor, such as when changing pressures, temperatures, flow rates or other parameters.

Benefits of the methods described herein include removing a material layer or cleaning or a substrate surface without damaging layers located on a substrate. The removal and/or cleaning methods allow for removal of contaminants from a refractory metal surface without affecting the critical dimensions of features formed therein. It is noted that the water vapor plasma treatment process as described here may also be utilized to clean a substrate surface with any materials as needed.

While the foregoing is directed to embodiments of the present invention, other and further embodiments of the invention may be devised without departing from the basic scope thereof, and the scope thereof is determined by the claims that follow.

We claim:

1. A method for cleaning a surface of a substrate, comprising: positioning a substrate in a processing chamber, the substrate having a refractory metal disposed thereon; exposing the substrate to a process gas comprising water vapor, wherein the process gas does not contain another oxygen containing gas other than water vapor; wherein the processing chamber is maintained at a first pressure of about 1 Torr to about 7 Torr heating the substrate to a first temperature for a first period of time, wherein the first temperature is greater than 100 degrees Celsius; after the first period of time, maintaining the temperature of the substrate at the first temperature and the processing chamber at a second pressure, wherein the second pressure is lower than the first pressure; forming a first plasma from the process gas to form a first activated water vapor, the first activated water vapor comprising H+ ions and O— ions, wherein the H+ ions and the O— ions are reacted to form —OH ions to create a ratio of H+ ions to O— ions which is greater than 2:1; exposing the refractory metal to the first activated water vapor at the second pressure for a second period of time; after the second period of time, maintaining the processing chamber at a third pressure between about 0.1 Torr and about 5 Torr; forming a second plasma from the process gas to form a second activated water vapor, the second activated water vapor comprising H+ ions and O— ions, wherein the H+ ions and the O— ions are reacted to form "OH ions to create a ratio of H+ ions to O— ions which is greater than 2:1; and exposing the refractory metal to the second activated water vapor for a third period of time.

2. The method of claim 1, wherein the forming a first and second plasma from the process gas further comprises applying a RF power between about 3000 watts and about 5000 watts.

3. The method of claim 1, wherein the water vapor is generated in the presence of argon, helium, or nitrogen.

4. The method of claim 1, wherein the first temperature is between about 100 degrees Celsius and about 400 degrees Celsius.

5. The method of claim 1, wherein exposing the refractory metal to the first and second activated water vapor further comprises supplying the first and second water vapor to the chamber in a pulsed mode.

6. The method of claim 1, wherein the refractory metal comprises one or more features formed therein.

7. The method of claim 1, wherein the refractory metal comprises a fifth period or a sixth period element.

8. The method of claim 1, wherein the processing chamber has two ports for transfer between atmosphere and vacuum environments.

9. The method of claim 1, wherein the second pressure is between about 0.1 Torr and 5 Torr.

10. The method of claim 1, wherein the first period of time is about 1 second to about 15 minutes.

11. A method for cleaning a substrate surface, comprising: positioning a substrate in a processing chamber, the substrate having a refractory metal disposed thereon; exposing the refractory metal to a process gas comprising water vapor supplied into the processing chamber, wherein the process gas does not contain another oxygen containing gas other than water vapor, the processing chamber being maintained at a first pressure of between 2 Torr and 4 Torr; heating the substrate to a first temperature for a first period of time, the first temperature being in a range from 100 degrees Celsius to 400 degrees Celsius; after the first period of time, maintaining the pressure in the processing chamber at a second pressure, wherein the second pressure is between 0.5 Torr and 2 Torr; forming a first plasma in the process gas to form a first activated water vapor, the first activated water vapor comprising H+ ions and O— ions, wherein the H+ ions and O— ions are reacted to form —OH ions to create a ratio of H+ ions to O— ions which is greater than 2:1, wherein the refractory metal is exposed to the first activated water vapor for a second period of time; after the second period of time, maintaining the processing chamber at a third pressure, wherein the third pressure is between about 0.1 Torr and about 5 Torr; and forming a second plasma in the process gas to form a second activated water vapor, the second activated water vapor comprising H+ ions and O— ions, wherein the H+ ions and O— ions are reacted to form —OH ions to create a ratio of H+ ions to O— ions which is greater than 2:1, wherein the refractory metal is exposed to the second activated water vapor for a third period of time, the second activated water vapor removing one or more residues.

12. The method of claim 11, wherein the process gas further comprises an oxygen containing gas or a hydrogen containing gas in addition to the water vapor.

13. The method of claim 11, wherein the forming the first and second plasma in the process gas further comprises applying a RF power between about 3000 watts and about 5000 watts.

14. The method of claim 11, further comprising maintaining the substrate temperature at between about 100 degrees Celsius and about 400 degrees Celsius while maintaining the substrate at the second pressure or at the third pressure.

15. The method of claim 11, wherein exposing the refractory metal to the first and second activated water vapor further comprises supplying the water vapor to the chamber in a pulsed mode.

16. The method of claim 11, wherein the first plasma and the second plasma are formed continuously.

17. The method of claim 11, wherein the processing chamber is an etching chamber.

18. The method of claim 11, wherein the refractory metal comprises tungsten.

* * * * *

UNITED STATES PATENT AND TRADEMARK OFFICE
CERTIFICATE OF CORRECTION

PATENT NO. : 10,217,627 B2
APPLICATION NO. : 14/045786
DATED : February 26, 2019
INVENTOR(S) : Danny Chien Lu et al.

It is certified that error appears in the above-identified patent and that said Letters Patent is hereby corrected as shown below:

In the Claims

In Column 12, Line 12, in Claim 1, delete "H+" and insert -- $H^+$ --, therefor.

In Column 12, Line 12, in Claim 1, delete "O—" and insert -- $O^-$ --, therefor.

In Column 12, Line 12, in Claim 1, delete "H+" and insert -- $H^+$ --, therefor.

In Column 12, Line 13, in Claim 1, delete "O—" and insert -- $O^-$ --, therefor.

In Column 12, Line 13, in Claim 1, delete "—OH ions" and insert -- $OH^-$ ions --, therefor.

In Column 12, Line 14, in Claim 1, delete "H+" and insert -- $H^+$ --, therefor.

In Column 12, Line 14, in Claim 1, delete "O—" and insert -- $O^-$ --, therefor.

In Column 12, Line 21, in Claim 1, delete "H+" and insert -- $H^+$ --, therefor.

In Column 12, Line 21, in Claim 1, delete "O—" and insert -- $O^-$ --, therefor.

In Column 12, Line 21, in Claim 1, delete "H+" and insert -- $H^+$ --, therefor.

In Column 12, Line 22, in Claim 1, delete "O—" and insert -- $O^-$ --, therefor.

In Column 12, Line 22, in Claim 1, delete ""OH ions" and insert -- $OH^-$ ions --, therefor.

In Column 12, Line 23, in Claim 1, delete "H+" and insert -- $H^+$ --, therefor.

In Column 12, Line 23, in Claim 1, delete "O—" and insert -- $O^-$ --, therefor.

Signed and Sealed this
Twenty-third Day of July, 2019

Andrei Iancu
*Director of the United States Patent and Trademark Office*

CERTIFICATE OF CORRECTION (continued)
U.S. Pat. No. 10,217,627 B2

In Column 12, Line 65, in Claim 11, delete "comprising H+" and insert -- comprising $H^+$ --, therefor.

In Column 12, Line 65, in Claim 11, delete "O—" and insert -- $O^-$ --, therefor.

In Column 12, Line 65, in Claim 11, delete "the H+" and insert -- the $H^+$ --, therefor.

In Column 12, Line 66, in Claim 11, delete "O—" and insert -- $O^-$ --, therefor.

In Column 12, Line 66, in Claim 11, delete "—OH ions" and insert -- $OH^-$ ions --, therefor.

In Column 12, Line 67, in Claim 11, delete "H+" and insert -- $H^+$ --, therefor.

In Column 12, Line 67, in Claim 11, delete "O—" and insert -- $O^-$ --, therefor.

In Column 13, Line 7, in Claim 11, delete "H+" and insert -- $H^+$ --, therefor.

In Column 13, Line 7, in Claim 11, delete "O—" and insert -- $O^-$ --, therefor.

In Column 13, Line 8, in Claim 11, delete "H+" and insert -- $H^+$ --, therefor.

In Column 13, Line 8, in Claim 11, delete "O—" and insert -- $O^-$ --, therefor.

In Column 13, Line 8, in Claim 11, delete "—OH ions" and insert -- $OH^-$ ions --, therefor.

In Column 13, Line 9, in Claim 11, delete "H+" and insert -- $H^+$ --, therefor.

In Column 13, Line 9, in Claim 11, delete "O—" and insert -- $O^-$ --, therefor.